(12) United States Patent
Bertolini et al.

(10) Patent No.: US 11,057,028 B2
(45) Date of Patent: Jul. 6, 2021

(54) DOUBLE CLOCK ARCHITECTURE FOR SMALL DUTY CYCLE DC-DC CONVERTER

(71) Applicant: STMicroelectronics S.r.l., Agrate Brianza (IT)

(72) Inventors: Alessandro Bertolini, Vermiglio (IT); Alberto Cattani, Cislago (IT); Stefano Ramorini, Arluno (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/559,118

(22) Filed: Sep. 3, 2019

(65) Prior Publication Data
US 2021/0067148 A1 Mar. 4, 2021

(51) Int. Cl.
| H03K 3/017 | (2006.01) |
| H03K 5/04 | (2006.01) |
| H03K 7/08 | (2006.01) |
| H03K 5/156 | (2006.01) |
| H02M 3/158 | (2006.01) |

(52) U.S. Cl.
CPC ........ *H03K 5/1565* (2013.01); *H02M 3/1582* (2013.01)

(58) Field of Classification Search
CPC ........................... H03K 5/1565; H02M 3/1582
USPC ........................................................ 327/175
See application file for complete search history.

(56) References Cited

U.S. PATENT DOCUMENTS

| 7,812,588 | B1 * | 10/2010 | Soh ..................... H02M 3/1582 323/351 |
| 9,148,136 | B2 | 9/2015 | Seo |
| 9,337,820 | B1 | 5/2016 | Solki et al. |
| 2009/0058483 | A1 | 3/2009 | Shin et al. |
| 2016/0006336 | A1 * | 1/2016 | Bennett ................. H02M 3/158 323/271 |

FOREIGN PATENT DOCUMENTS

| CN | 106452052 A | 2/2017 |
| KR | 101115475 B1 | 2/2012 |

* cited by examiner

*Primary Examiner* — Metasebia T Retebo
(74) *Attorney, Agent, or Firm* — Crowe & Dunlevy

(57) ABSTRACT

A DC-DC converter includes clock generation circuitry generating first and second clock signals that are out of phase, and a control signal generator generating a switching control signal at an edge of the second clock signal based upon a comparison of an error voltage to a summed voltage. Boost circuitry charges an energy storage component during an on-phase and discharges the energy storage component during an off-phase to thereby generate an output voltage. The on-phase and off-phase are set as a function of the switching control signal. Sum voltage generation circuitry generates a ramp voltage in response to an edge of the first clock signal and generates the summed voltage at an edge of the second clock signal. The sum voltage represents a sum of the ramp voltage and a voltage representative of the current flowing in the energy storage component during the on-phase.

26 Claims, 3 Drawing Sheets

US 11,057,028 B2

DOUBLE CLOCK ARCHITECTURE FOR SMALL DUTY CYCLE DC-DC CONVERTER

TECHNICAL FIELD

This application is directed to the field of DC-DC converters, and in particular, to a DC-DC converter utilizing a dual-clock architecture to enhance operation at low duty cycles.

BACKGROUND

DC-DC converters, such as boost converters, are commonly used in a variety of operations to generate requisite rail voltages. A sample known DC-DC converter is a boost converter 10, shown in FIG. 1A, and includes an inductor coupled between an input voltage supply 11 and the anode of a diode D1, with the cathode of the diode D1 being coupled to a load 12. A switch S is coupled between the inductor and the anode of the diode D1, and selectively (under control of the control circuitry 13) couples the inductor to ground.

In operation, the control circuitry 13 generates a pulse width modulation (PWM) control signal PWM_CTRL for driving actuation/deactivation of the switch S, and the resulting pulse width modulation cycle extends from falling edge to falling edge of the clock signal CLK (the timing of which is shown in FIG. 1B). In particular, upon the falling edge of the clock signal CLK, the "on" period of the pulse width modulation cycle during which switch S is actuated begins and continues for time Ton, and the "off" period of the pulse width modulation cycle during which switch S is deactivated begins when the "on" period ends and continues for time Toff, with time Toff ending at the next falling edge of the clock signal CLK.

At the start of Ton, the switch S is closed, and current flows through the inductor L from Vsupply to ground, with the result being that the inductor L stores energy in the form of a magnetic field. When Ton ends and Toff begins, the switch S opens, disconnecting the right side terminal of the inductor L from ground. The result is that the energy stored in the inductor L begins to discharge in the form of a current flowing into the diode D1, forming a voltage Vload across the load 12 (and charging a load capacitor if the load 12 is capacitive). Due to the energy discharged from the inductor L in the form of current, the current flowing into the load is greater than it would be from the input voltage supply 11 alone, and therefore Vload is greater than it would otherwise be (and is, thus, "boosted"). The control circuit 13 senses Vload, compares it to a reference, and changes the duty cycle of PWM_CTRL based on the differences between them (e.g., changes the length of Ton relative to Toff) in order to drive Vload to be equal to the reference.

In certain applications where a DC-DC converter is used, such as in powering an organic light emitting diode (OLED) based display panel, it is desired for the duty cycle of PWM_CTRL to be low. However, as can be seen in FIG. 1B, at the beginning of the on period Ton, Iramp is ringing and not stable. Therefore, measurements made during Ton may be incorrect because the outputs of the components in the control circuitry 13 (such as Iramp) have not settled. Since Ton decreases as the PWM duty cycle decreases, there is a minimum length requirement imposed on Ton so that measurements can be made once the outputs of the components in the control circuitry 13 (such as Iramp) have settled. Otherwise, the measurements may be inaccurate, leading to PWM_CTRL being incorrectly generated and the PWM duty cycle not being properly formed, and the performance of the DC-DC converter 10 not being as desired.

One known way to address this drawback would be to instead use a DC-DC converter utilizing pulse frequency modulation (PFM) instead of PWM, with the desired duty cycle being reached through frequency modulation (i.e., by modulating the frequency of the clock signal). However, for low duty cycle applications where a fixed frequency DC-DC converter is desired, a PFM based DC-DC converter is clearly not suitable.

Another way to address this drawback is to use a DC-DC converter utilizing a pulse skipping mode. In this operation, one or more pulses in PWM_CTRL would be suppressed (i.e., skipped). However, this is not particularly useful for use in some applications, such as OLED displays, because the pulse skipping introduces noise which presents itself as visible flickering in some displays.

Therefore, further development into PWM based DC-DC converters is required.

SUMMARY

One claimed aspect disclosed herein is a DC-DC converter boosting an input voltage to an output voltage. The DC-DC converter includes clock generation circuitry generating first and second clock signals that are out of phase with each other, a control signal generator generating a switching control signal at an edge of the second clock signal based upon a comparison of an error voltage to a summed voltage, and boost circuitry. The boost circuitry is configured to charge an energy storage component during an on-phase and to discharge the energy storage component during an off-phase, to thereby generate the output voltage. The on-phase and off-phase are set as a function of the switching control signal. Sum voltage circuitry is configured to generate a ramp voltage, and to generate the summed voltage at an edge of the second clock signal, the sum voltage representing a sum of the ramp voltage and a voltage representative of a current signal carrying information about a storage component current flowing in the energy storage component during the on-phase.

Another claimed aspect disclosed herein is a DC-DC converter boosting an input voltage at an input to an output voltage at an output. The DC-DC converter includes an energy storage component coupled between the input voltage and an intermediate node, and a control signal generator providing a switching control signal based upon a comparison of an error voltage to a sum voltage. The sum voltage is a function of a ramp voltage and a voltage representative of a current signal carrying information about a storage component current flowing in the energy storage component during an on-phase. The error voltage is representative of a difference between a desired operating point and the output voltage. Boost circuitry is configured to charge the energy storage component during the on-phase and to discharge the energy storage component during an off-phase, to thereby generate the output voltage. The on-phase and off-phase are set as a function of the switching control signal. Sum voltage circuitry is configured to generate the sum voltage.

The sum voltage circuitry includes a ramp voltage generator configured to cause a ramp voltage to rise, in response to a falling edge of a first clock signal, and to cause the ramp voltage to fall, in response to a rising edge of the first clock signal. The sum voltage circuitry also includes a first voltage to current converter circuit configured to convert the ramp voltage to a ramp current. The sum voltage circuitry also includes a second voltage to current converter circuit configured to convert the voltage at the intermediate node to a current signal carrying information about the storage component current, in response to a falling edge of a second clock signal, the second clock signal being out of phase with the first clock signal. The sum voltage circuitry further includes a branch or element configured to generate the sum voltage based upon a sum of the ramp current and the current signal carrying information about the storage component current. The causing of the ramp voltage to rise by the ramp voltage generator in response to the falling edge of the first clock signal results in settling of the ramp current prior to the falling edge of the second clock signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

As will be described in detail herein, with reference to FIG. 2, this disclosure teaches the generation and exploitation of a dedicated setup time frame Tset during which components in control circuitry for a PWM controlled DC-DC converter settle such that proper measurements can be made during the short on periods (Ton) involved in low duty cycle PWM operation. As will be described below, this is achieved through the usage of two clock signals CLK1 and CLK2 having a same frequency and duty cycle, but out of phase by time period Tact (illustratively with the rising edge of CLK2 coinciding with the falling edge of CLK1). In some cases however, CLK1 and CLK2 may have a same frequency, but a different duty cycle.

In particular, CLK1 will be used to turn on and/or reset the components in the control circuitry so that during CLK2 the components in the control circuitry can be set up and ready for operation during the on period Ton of the next PWM cycle. Therefore, at the falling edge of CLK2 when Ton begins, the components in the control circuitry will not exhibit non-linearity or other undesired behavior. Consequently, regardless of the duration of Ton, measurements can be accurately made, and the DC-DC converter can be properly controlled.

The structure of a DC-DC converter 100 implementing this control scheme will first be described with reference to FIG. 3, then the structure of the ramp generator and peak current sensing circuit 105 of the DC-DC converter 100 will be described with reference to FIG. 4, and then the operation of the DC-DC converter 100 and ramp generator and peak current sensing circuit 105 will be described.

Figure 2:
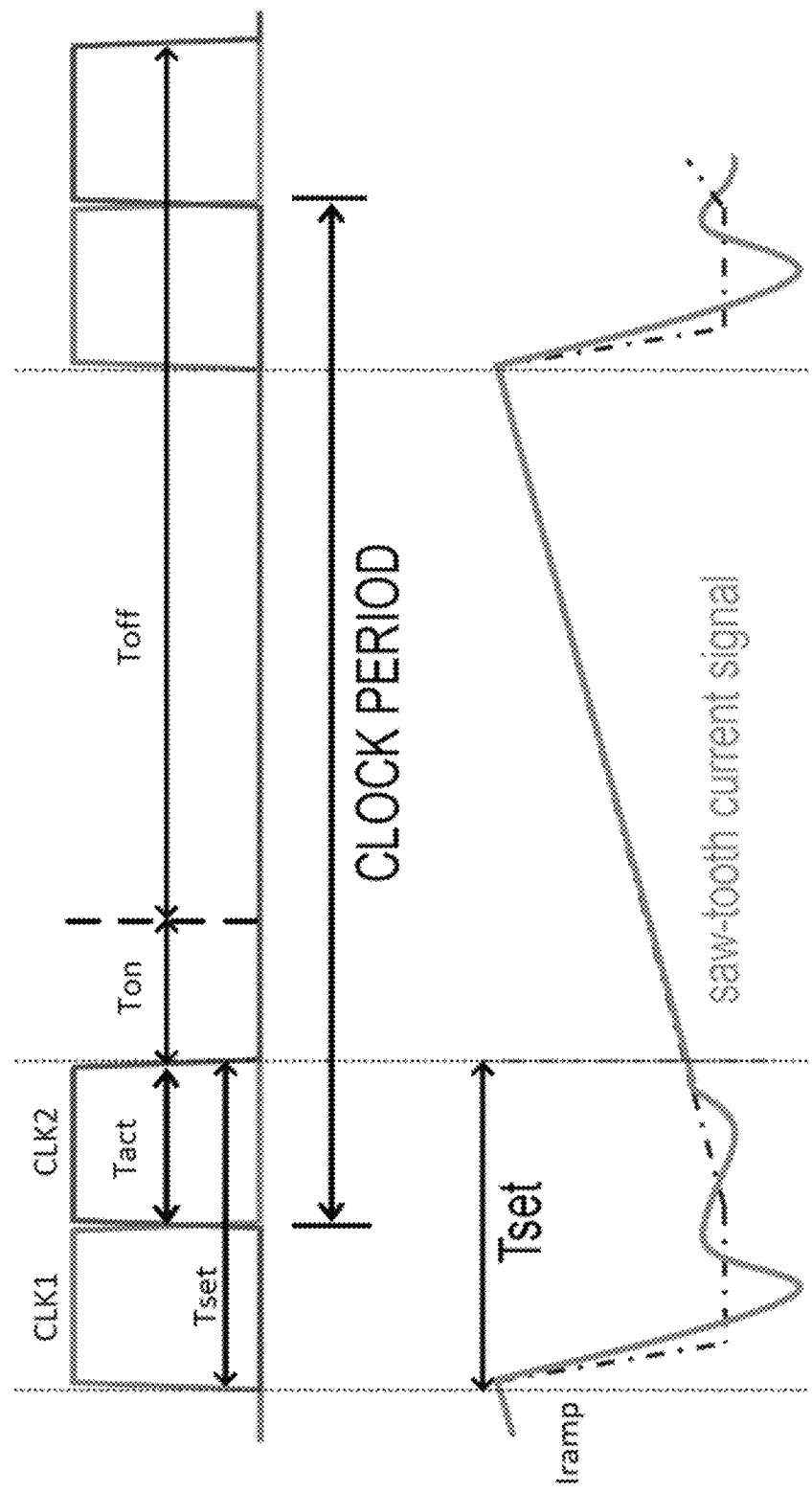
FIG. 2 is a graph showing clock voltages and resulting ramp current values for a DC-DC converter disclosed herein.
Figure 3:
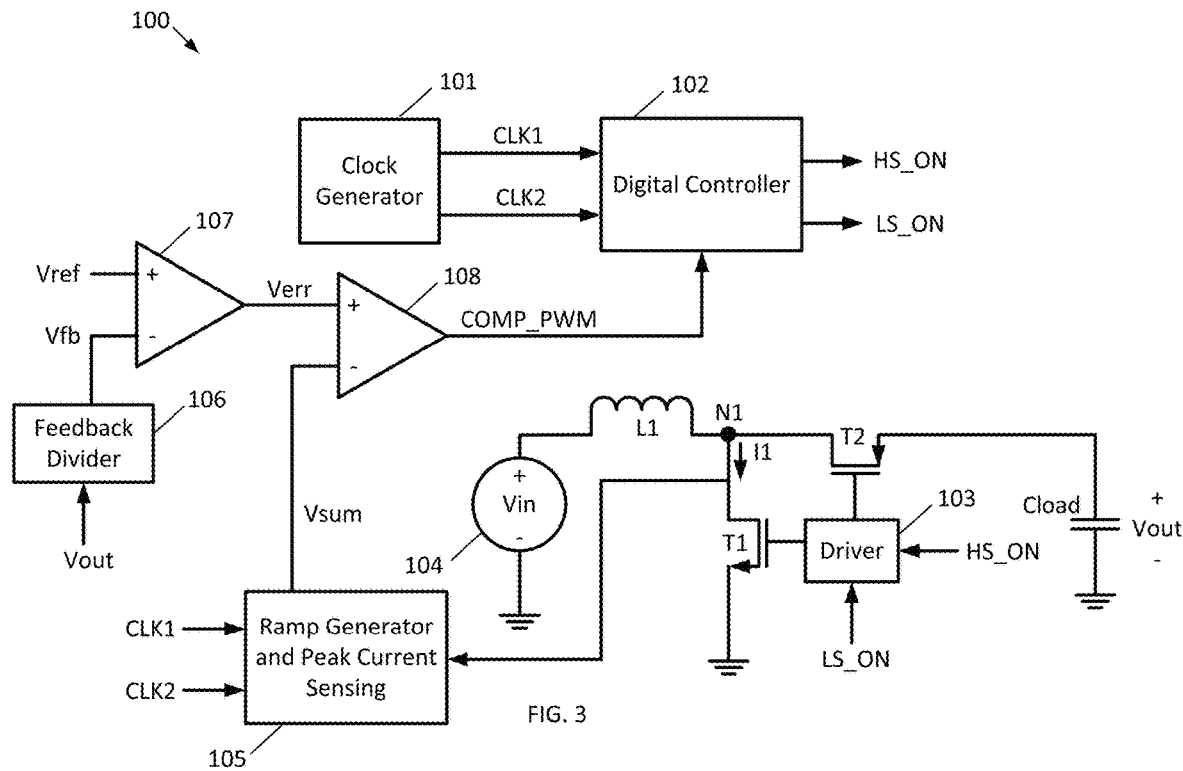
FIG. 3 is a schematic block diagram of a DC-DC converter disclosed herein that utilizes the dual clocks of FIG. 2 to enhance low duty cycle operation.

Turning now to FIG. 3, the DC-DC converter 100 includes a clock generator 101 generating first and second clock signals CLK1, CLK2. The first clock signal CLK1 and second clock signal CLK2 are shown in FIG. 2 and described above, and are equal in frequency and duty cycle but out of phase by Tact. A digital controller 102 receives the first and second clock signals CLK1, CLK2, and from these clock signals together with the COMP_PWM signal (described below) generates a high side on signal HS_ON and a low side on signal LS_ON for passage to the driver 103. The ratio of the pulse width of LS_ON to the sum of the pulse widths of HS_ON and LS_ON sets the PWM duty cycle for the DC-DC converter 100, with LS_ON setting the on period Ton and HS_ON setting the of period Toff.

An inductor L1 is coupled between an input voltage generator 104 and node N1. A n-channel transistor T1 has its drain coupled to node N1, its source coupled to ground, and its gate controlled by driver 103 (in response to the LS_ON signal). A p-channel transistor T2 has its source coupled to a load capacitor Cload, its drain coupled to node N1, and its gate controlled by the driver 103 (in response to the HS_ON signal). The load capacitor Cload is coupled between the source of the p-channel transistor T2 and ground. The output voltage Vout results from the provision of current by the p-channel transistor T2 to the load capacitor Cload.

A ramp generator and peak current sensing circuit 105 operates based upon the first and second clock signals CLK1, CLK2, has an input coupled to the drain of the n-channel transistor T1 to sense the drain to source voltage of the n-channel transistor T1, and sums the drain to source voltage of the n-channel transistor T1 with a ramp voltage Vramp to produce an output Vsum.

An error amplifier 107 has its non-inverting input coupled to a reference voltage Vref, its inverting input coupled to a feedback divider 106 to receive a scaled feedback voltage Vfb representative of the output voltage Vout, and generates an error voltage Verr at its output that represents the difference between the feedback voltage Vfb and the error voltage Verr. A comparator 108 has its non-inverting input coupled to receive the error voltage Verr, its inverting input coupled to receive the voltage Vsum from the ramp generator and peak current sensing circuit 105, and generates the COMP_PWM signal based upon the comparison of Verr to Vsum, with COMP_PWM controlling the PWM duty cycle of the DC-DC converter 100.

Figure 4:
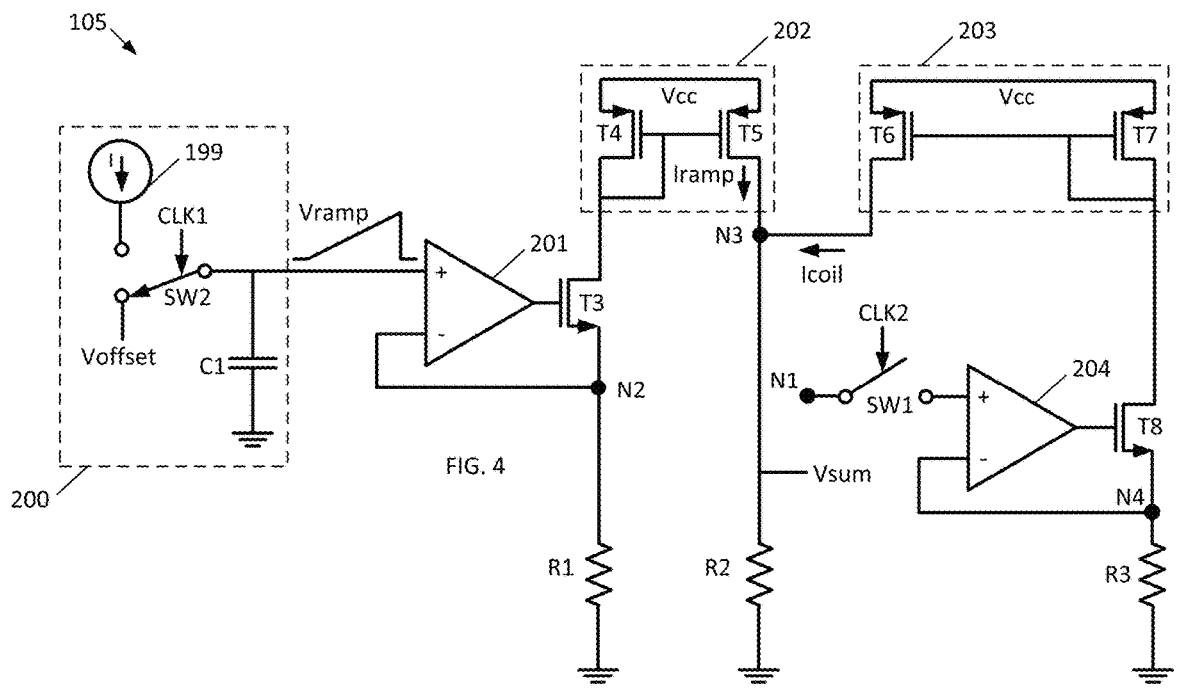
FIG. 4 is a schematic diagram of the ramp generator and peak current sensing circuit of FIG. 3.

Turning now to FIG. 4, the ramp generator and peak current sensing circuit 105 includes a ramp generator 200, operating based upon the first clock signal CLK1, that generates a voltage ramp Vramp. In particular, the ramp generator 200 includes a capacitor C1 that is coupled by a switch SW2 to a current source 199 to receive a current I and to an offset voltage Voffset that is below the supply voltage Vcc but above ground. The switch SW2 is controlled by the first clock signal CLK1.

The capacitor C1 is coupled between the non-inverting terminal of the operational amplifier 201 and ground. A n-channel transistor T3 has its drain coupled to the input of a current mirror 202, its source coupled to node N2, and its gate coupled to the output of the buffer 201. A resistor R1 is coupled between node N2 and ground. The operational amplifier 201, n-channel transistor T3, and resistor R1 therefore form a voltage to current converter.

The current mirror 202 has its input coupled to the drain of the n-channel transistor T3 and its output coupled to node N3. The current mirror 202 is comprised of a p-channel transistor T4 having its source coupled to a supply voltage Vcc, its drain coupled to the drain of the n-channel transistor T3, and its gate coupled to its drain and to the gate of p-channel transistor T5. The p-channel transistor T5 has its source coupled to the supply voltage Vcc, its drain coupled to node N3, and its gate coupled to the gate of the p-channel transistor T4.

An operational amplifier 204 has its non-inverting terminal selectively coupled to node N1 via switch SW1, and switch SW1 is actuated by the falling edge of the CLK2 signal and is released at the conclusion of Ton. A n-channel transistor T8 has its drain coupled to the input of current mirror 203, its source coupled to node N4, and its gate coupled the output of the operational amplifier 204. A resistor R3 is coupled between node N4 and ground. Therefore, the operational amplifier 204, n-channel transistor T8, and resistor R3 form a voltage to current converter.

The current mirror 203 has its input coupled to the drain of the n-channel transistor T8 and its output coupled to the node N3. The current mirror 203 is comprised of p-channel transistor T7 having its source coupled to the supply voltage Vcc, its drain coupled to the drain of the n-channel transistor T8, and its gate coupled to its drain as well as to the gate of p-channel transistor T6. The p-channel transistor T6 has its source coupled to the supply voltage Vcc, its drain coupled to node N3, and its gate coupled to the gate of the p-channel transistor T7. A resistor R2 is coupled between node N3 and ground, and the voltage Vsum is produced at node N3 by the sum of Iramp and Icoil.

Operation of the DC-DC converter 100 will now be described. At the beginning of Ton (see FIG. 2), LS_ON is asserted by the digital controller 102, resulting in the driver 103 turning on the n-channel transistor T1, causing the current T1 to flow through the inductor L1 from Vin to ground through the n-channel transistor T1, storing energy in the inductor L1. At the end of Ton and the beginning of Toff, HS_ON is asserted and LS_ON is deasserted by the digital controller 102, resulting in the driver 103 turning off the n-channel transistor T1, and turning on the p-channel transistor T2. Since the inductor L1 is now disconnected from ground, it begins to discharge energy in the form of current, through the p-channel transistor T2, into the load capacitor Cload, increasing the magnitude of Vout over what it would be with the current sourced from the input voltage source 104 alone.

Generation of HS_ON and LS_ON by the digital controller 102 is now described. The ramp generator 105 generates the voltage Vsum, which represents a sum of the ramp voltage Vramp and the voltage at N1. As will be explained in detail below, due to the use of the clock signals CLK1 and CLK2, as opposed to a single clock signal, Vsum is accurate and settled at the beginning of Ton, eliminating the issues faced by the prior art at low duty cycles.

The error amplifier 107 generates the error voltage Verr as a result of a comparison of the feedback voltage Vfb (representative of Vout) to a reference voltage Vref. The comparator 108 compares the error voltage Verr to Vsum, and generates a PWM control voltage COMP_PWM as a result of the comparison. The digital controller 102 generates the HS_ON and LS_ON signals, based on which the driver 103 controls operation of the transistors T1 and T2 (and thus sets the voltage Vout), from the PWM control voltage COMP_PWM.

Generation of Vsum is now described. Referring now to the operation of the ramp generator and peak current sensing circuit 105 as shown in FIG. 4, the ramp generator 200 uses the first clock signal CLK1 to generate the voltage ramp Vramp. In particular, when the first clock signal CLK1 is low, the switch SW2 is coupled to the current source 199 so that the capacitor C1 charges, generating the ramp voltage Vramp. The minimum voltage of Vramp is Voffset and the maximum voltage of Vramp is dependent on the length of time that the first clock signal CLK1 is low.

Since the operational amplifier 201 is in a closed loop with the n-channel transistor T3 and the resistor R1, it modulates its output to the gate of n-channel transistor T3 to force the voltage across R1 to be equal to Vramp, drawing a ramp current Iramp proportional to the voltage ramp Vramp from the input of the current mirror 202. The ramp current Iramp is mirrored by the current mirror 202 to node N3.

As can be seen in FIG. 2, at the first falling edge of the first clock signal CLK1, Iramp begins to rise (because Vramp begins to rise as capacitor C1 is charged by the current I). Note that the operational amplifier 201 in voltage to current configuration has a limited bandwidth, and therefore Iramp has a settling time, and in some conditions, may not settle until the falling edge of CLK2, which represents the end of Tset. At this falling edge of CLK2, the operational amplifier 201 has therefore correctly settled and is properly tracking Vramp.

As can also be seen, at the next rising edge of CLK1, the switch SW2 couples the capacitor C1 to the offset voltage Voffset, which causes the capacitor C1 to discharge to the offset voltage Voffset, with the result being that Vramp discharges to the offset voltage Voffset and the ramp current Iramp falls accordingly.

As stated, at the first falling edge of CLK2, Iramp has settled. It is therefore ready for accurate processing. Consequently, at the first falling edge of CLK2, the switch SW1 closes, coupling the voltage at node N1 (representative of the drain current I1 of the n-channel transistor T1) to the non-inverting terminal of the operational amplifier 204. The operational amplifier 204 is in a closed loop with the n-channel transistor T8 and the resistor R3, and therefore forces the voltage across R3 to be equal to the voltage at N1 by modulating the gate voltage of n-channel transistor T8, converting the voltage at N1 (which is the drain to source voltage of the n-channel transistor T1) to a current Icoil. The current Icoil is mirrored by the current mirror 203 to node N3, where it is summed with Iramp and the resulting voltage Vsum is read across the resistor R2. Due to the control of switch SW2 by the first clock signal CLK1, but the switch SW1 being actuated by the falling edge of the second clock signal CLK2 and released upon the conclusion of Ton, Vsum is able to be accurately and properly generated starting at the beginning of the on time Ton.

Figure 1A:
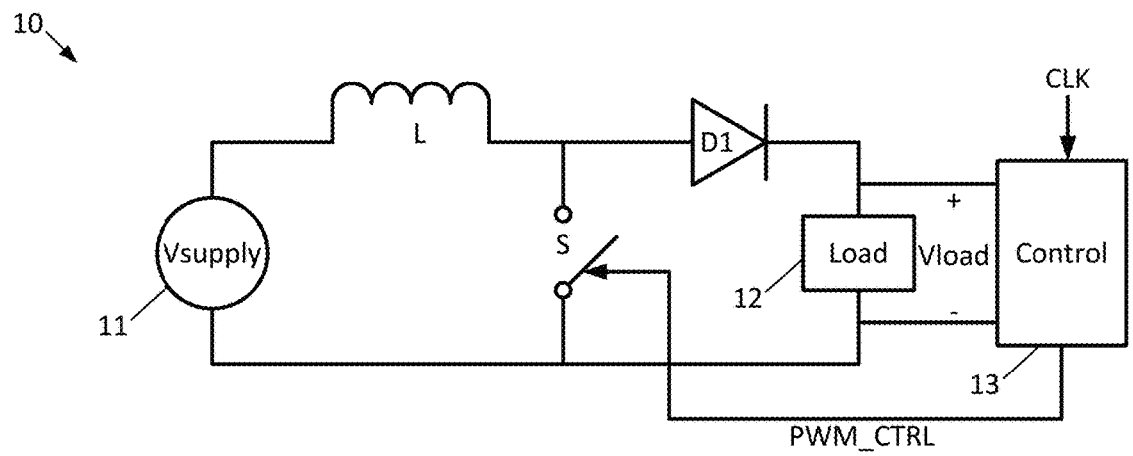
FIG. 1A is a schematic diagram of a known boost converter.
Figure 1B:
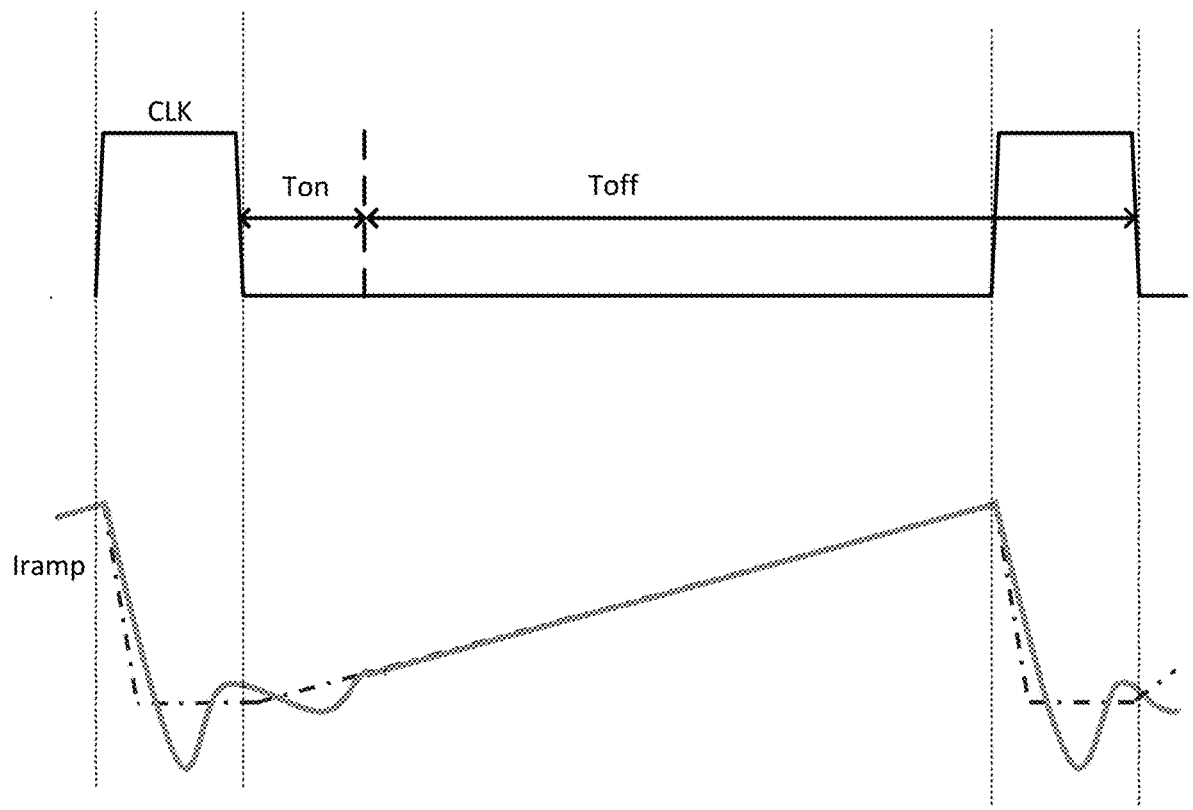
FIG. 1B is a graph showing the switching cycle period of the boost converter of FIG. 1A and the resulting ramp current values generated in the control circuitry.

If the switches SW1 and SW2 were controlled by the same clock signal (for example, CLK as shown in FIG. 1B), at the beginning of Ton, Vsum would not be accurate because Iramp would not be settled. However, due the control of switch SW2 by the first clock signal CLK1, but the switch SW1 being actuated by the falling edge of the second clock signal CLK2 and released upon the conclusion of Ton, Ton can have any duration, and therefore low duty cycle operation of the DC-DC converter 100 is improved over the prior art PWM designs in which Vsum (and therefore COMP_PWM) would be inaccurate if Ton was less than a certain duration.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A DC-DC converter boosting an input voltage to an output voltage, the DC-DC converter comprising:
   clock generation circuitry configured to generate first and second clock signals that are out of phase with each other;
   a control signal generator configured to generate a switching control signal at an edge of the second clock signal based upon a comparison of an error voltage to a summed voltage;
   boost circuitry configured to charge an energy storage component during an on-phase and to discharge the energy storage component during an off-phase to thereby generate the output voltage, wherein the on-phase and off-phase are set as a function of the switching control signal; and
   sum voltage circuitry configured to:
      generate a ramp voltage based upon the first clock signal; and
      from a falling edge of the second clock signal until an end of the on-phase, generate the summed voltage to represent a sum of the ramp voltage and a voltage representative of a current signal carrying information about a storage component current flowing in the energy storage component during the on-phase, but from a beginning of the off-phase until a next falling edge of the second clock signal, generate the summed voltage to represent only the ramp voltage, the off-phase beginning at the end of the on-phase.

2. The DC-DC converter of claim 1, wherein the sum voltage circuitry generates the ramp voltage at an edge of the first clock signal.

3. The DC-DC converter of claim 1, wherein the first and second clock signals are out of phase such that falling edges of the first clock signal substantially coincide with rising edges of the second clock signal.

4. The DC-DC converter of claim 1, wherein the first and second clock signals have a same frequency and a same duty cycle as one another.

5. The DC-DC converter of claim 1, wherein the first and second clock signals have a same frequency as one another but have a different duty cycle from one another.

6. A DC-DC converter boosting an input voltage to an output voltage, the DC-DC converter comprising:
   clock generation circuitry configured to generate first and second clock signals that are out of phase with each other;
   a control signal generator configured to generate a switching control signal at an edge of the second clock signal based upon a comparison of an error voltage to a summed voltage;
   boost circuitry configured to charge an energy storage component during an on-phase and to discharge the energy storage component during an off-phase to thereby generate the output voltage, wherein the on-phase and off-phase are set as a function of the switching control signal; and
   sum voltage circuitry configured to:
      generate a ramp voltage; and
      generate the summed voltage at an edge of the second clock signal, the sum voltage representing a sum of the ramp voltage and a voltage representative of a current signal carrying information about a storage component current flowing in the energy storage component during the on-phase;
   wherein the sum voltage circuitry comprises a ramp voltage generator configured to cause the ramp voltage to rise at an edge of the first clock signal and to cause the ramp voltage to fall at a next edge of the first clock signal.

7. The DC-DC converter of claim 6, wherein the first and second clock signals are out of phase such that falling edges of the first clock signal substantially coincide with rising edges of the second clock signal.

8. The DC-DC converter of claim 6, wherein the first and second clock signals have a same frequency and a same duty cycle as one another.

9. The DC-DC converter of claim 6, wherein the first and second clock signals have a same frequency as one another but have a different duty cycle from one another.

10. A DC-DC converter boosting an input voltage to an output voltage, the DC-DC converter comprising:
    clock generation circuitry configured to generate first and second clock signals that are out of phase with each other;
    a control signal generator configured to generate a switching control signal at an edge of the second clock signal based upon a comparison of an error voltage to a summed voltage;
    boost circuitry configured to charge an energy storage component during an on-phase and to discharge the energy storage component during an off-phase to thereby generate the output voltage, wherein the on-phase and off-phase are set as a function of the switching control signal; and
    sum voltage circuitry configured to:
       generate a ramp voltage; and
       generate the summed voltage at an edge of the second clock signal, the sum voltage representing a sum of the ramp voltage and a voltage representative of a current signal carrying information about a storage component current flowing in the energy storage component during the on-phase;
    wherein the boost circuitry is coupled to the energy storage component at an intermediate node; and
    wherein the sum voltage circuitry comprises:
       a first voltage to current converter circuit configured to convert the ramp voltage to a ramp current;
       a second voltage to current converter circuit configured to convert a voltage at the intermediate node to the current signal, in response to the edge of the second clock signal;
       a summing junction configured to sum the ramp current and the current signal to produce a summed current; and
       a branch or element configured to convert the summed current to the summed voltage.

11. The DC-DC converter of claim 10, further comprising a first switch controlled by the second clock signal to selectively couple the intermediate node to the second voltage to current converter.

12. The DC-DC converter of claim 11, wherein the first switch is closed in response to the edge of the second clock signal and opened at a beginning of the off-phase.

13. The DC-DC converter of claim 10, further comprising a first current mirror configured to mirror the ramp current to the summing junction and a second current mirror configured to mirror a replica of the current signal to the summing junction.

14. The DC-DC converter of claim 10, wherein the first and second clock signals are out of phase such that falling edges of the first clock signal substantially coincide with rising edges of the second clock signal.

15. The DC-DC converter of claim 10, wherein the first and second clock signals have a same frequency and a same duty cycle as one another.

16. The DC-DC converter of claim 10, wherein the first and second clock signals have a same frequency as one another but have a different duty cycle from one another.

17. A DC-DC converter boosting an input voltage to an output voltage, the DC-DC converter comprising:
   clock generation circuitry configured to generate first and second clock signals that are out of phase with each other;
   a control signal generator configured to generate a switching control signal at an edge of the second clock signal based upon a comparison of an error voltage to a summed voltage;
   boost circuitry configured to charge an energy storage component during an on-phase and to discharge the energy storage component during an off-phase to thereby generate the output voltage, wherein the on-phase and off-phase are set as a function of the switching control signal; and
   sum voltage circuitry configured to:
      generate a ramp voltage; and
      generate the summed voltage at an edge of the second clock signal, the sum voltage representing a sum of the ramp voltage and a voltage representative of a current signal carrying information about a storage component current flowing in the energy storage component during the on-phase;
   wherein the boost circuitry is coupled to the energy storage component at an intermediate node;
   wherein the boost circuitry comprises:
      a low side transistor configured to couple the intermediate node to ground during the on-phase; and
      a high side transistor configured to couple the intermediate node to a load to produce the output voltage during the off-phase;
   a digital controller configured to generate a low side on signal as being asserted during the on-phase and to generate a high side on signal as being asserted during the off-phase to thereby set a switching duty cycle, in response to the switching control signal; and
   a gate driver configured to turn on the low side transistor during the on-phase but turn off the low side transistor during the off-phase, and to turn on the high side transistor during the off-phase but turn off the high side transistor during the on-phase.

18. The DC-DC converter of claim 17, wherein the first and second clock signals are out of phase such that falling edges of the first clock signal substantially coincide with rising edges of the second clock signal.

19. The DC-DC converter of claim 17, wherein the first and second clock signals have a same frequency and a same duty cycle as one another.

20. The DC-DC converter of claim 17, wherein the first and second clock signals have a same frequency as one another but have a different duty cycle from one another.

21. A DC-DC converter boosting an input voltage at an input to an output voltage at an output, the DC-DC converter comprising:
   an energy storage component coupled between the input voltage and an intermediate node;
   a control signal generator configured to provide a switching control signal based upon a comparison of an error voltage to a sum voltage, the sum voltage being a function of a ramp voltage and a voltage representative of a current signal carrying information about a storage component current flowing in the energy storage component during an on-phase, the error voltage being representative of a difference between a desired operating point and the output voltage;
   boost circuitry configured to charge the energy storage component during the on-phase and to discharge the energy storage component during an off-phase to thereby generate the output voltage, wherein the on-phase and off-phase are set as a function of the switching control signal; and
   sum voltage circuitry configured to generate the sum voltage, the sum voltage circuitry comprising:
      a ramp voltage generator configured to:
         cause a ramp voltage to rise, in response to a falling edge of a first clock signal; and
         cause the ramp voltage to fall, in response to a rising edge of the first clock signal;
      a first voltage to current converter circuit configured to convert the ramp voltage to a ramp current;
      a second voltage to current converter circuit configured to convert a voltage at the intermediate node to the current signal, in response to a falling edge of a second clock signal, the second clock signal being out of phase with the first clock signal; and
      a branch or element configured to generate the sum voltage based upon a sum of the ramp current and the current signal;
      wherein the causing of the ramp voltage to rise by the ramp voltage generator in response to the falling edge of the first clock signal results in settling of the ramp current prior to the falling edge of the second clock signal.

22. The DC-DC converter of claim 21, wherein the ramp voltage generator comprises:
   a current source generating a charging current;
   a capacitor across which the ramp voltage is stored, the capacitor being coupled to the first voltage to current converter; and
   a switch configured to:
      couple the current source to the capacitor to charge the capacitor, in response to the falling edge of the first clock signal; and
      couple the capacitor to a discharge voltage to discharge the capacitor, in response to the rising edge of the first clock signal.

23. The DC-DC converter of claim 21, wherein the first voltage to current converter comprises:
   a transistor;
   a resistance coupled to the transistor and configured to generate a voltage indicative of a drain current of the transistor; and
   an amplifier having a first input coupled to the ramp voltage, a second input coupled to the resistance, and an output coupled to a control terminal of the transistor.

24. The DC-DC converter of claim 21, wherein the second voltage to current converter comprises:
   a transistor;
   a resistance coupled to the transistor and configured to generate a voltage indicative of a drain current of the transistor; and
   an amplifier having a first input coupled to the intermediate node by a switch in response to the falling edge of the second clock signal, a second input coupled to the resistance, and an output coupled to a control terminal of the transistor.

25. The DC-DC converter of claim 21,
wherein the first voltage to current converter comprises:
   a first transistor;
   a first resistance coupled to the first transistor and configured to generate a first voltage indicative of a drain current of the first transistor; and
   a first amplifier having a first input coupled to the ramp voltage, a second input coupled to the first resistance, and an output coupled to a control terminal of the first transistor;
wherein the second voltage to current converter comprises:
   a second transistor;
   a second resistance coupled to the second transistor and configured to generate a second voltage indicative of a drain current of the second transistor; and
   a second amplifier having a first input coupled to the intermediate node by a switch in response to the falling edge of the second clock signal, a second input coupled to the second resistance, and an output coupled to a control terminal of the second transistor;
further comprising:
   a first current mirror mirroring the drain current of the first transistor to a summing junction; and
   a second current mirror mirroring the drain current of the second transistor to the summing junction; and
wherein the branch or element comprises a resistor coupled between the summing junction and ground.

26. The DC-DC converter of claim 21,
wherein the switching control signal is a PWM control signal;
wherein the energy storage component comprises an inductor; and
wherein the boost circuitry comprises:
   a driver;
   a first n-channel transistor having a drain coupled to the intermediate node, a source coupled to ground, and a gate coupled to and controlled by the driver; and
   a first p-channel transistor having a source coupled to the output to produce the output voltage, a drain coupled to the intermediate node, and a gate coupled to and controlled by the driver;
wherein the driver is configured to turn on the first n-channel transistor and turn off the first p-channel transistor during the on-phase, and configured to turn off the first n-channel transistor and turn on the first p-channel transistor during the off-phase, based upon the PWM control signal.

* * * * *